(12) United States Patent
Westphal

(10) Patent No.: US 7,170,291 B2
(45) Date of Patent: Jan. 30, 2007

(54) ADDITIONAL FRINGE FIELD SHIELD FOR A SUPERCONDUCTING MAGNET COIL SYSTEM

(75) Inventor: Michael Westphal, Offenbach (DE)

(73) Assignee: Bruker Biospin GmbH, Rheinstetten (DE)

( * ) Notice: Subject to any disclaimer, the term of this patent is extended or adjusted under 35 U.S.C. 154(b) by 127 days.

(21) Appl. No.: 10/986,925

(22) Filed: Nov. 15, 2004

(65) Prior Publication Data

US 2005/0110494 A1    May 26, 2005

(30) Foreign Application Priority Data

Nov. 22, 2003 (DE) ................ 103 54 677

(51) Int. Cl.
G01R 33/20 (2006.01)
G01R 33/28 (2006.01)
G01R 33/38 (2006.01)

(52) U.S. Cl. .............. 324/319; 335/301; 335/299; 324/320

(58) Field of Classification Search ............. None
See application file for complete search history.

(56) References Cited

U.S. PATENT DOCUMENTS

| 4,803,452 | A |   | 2/1989  | Saji |        |
|-----------|---|---|---------|------|--------|
| 4,881,035 | A | * | 11/1989 | Siebold | 324/320 |
| 4,968,961 | A |   | 11/1990 | Miyajima |     |
| 5,001,447 | A | * | 3/1991  | Jayakumar | 335/299 |
| 5,012,217 | A |   | 4/1991  | Palkovich |     |
| 5,276,399 | A | * | 1/1994  | Kasten et al. | 324/319 |
| 5,568,051 | A | * | 10/1996 | Yamagata | 324/318 |
| 5,592,087 | A | * | 1/1997  | Richard et al. | 324/318 |
| 6,369,464 | B1 | * | 4/2002 | Schauwecker et al. | 307/91 |
| 6,507,259 | B2 |   | 1/2003  | Westphal |     |
| 6,556,012 | B2 | * | 4/2003 | Yamashita | 324/318 |
| 2001/0022515 | A1 | * | 9/2001 | Yamashita et al. | 324/300 |
| 2002/0014938 | A1 | * | 2/2002 | Westphal et al. | 335/301 |
| 2003/0107376 | A1 | * | 6/2003 | Yasuhara | 324/318 |
| 2005/0110494 | A1 | * | 5/2005 | Westphal | 324/318 |
| 2005/0110602 | A1 | * | 5/2005 | Westphal | 335/301 |
| 2005/0253583 | A1 | * | 11/2005 | Kasten et al. | 324/318 |

FOREIGN PATENT DOCUMENTS

| EP | 0 251 342 |   | 1/1988 |
|----|-----------|---|--------|
| EP | 0 468 415 |   | 1/1992 |
| EP | 0 468 425 |   | 1/1992 |
| EP | 0 488 464 |   | 6/1992 |
| EP | 0453454 A | * | 9/1994 |
| GB | 2 370 360 |   | 6/2002 |
| WO | WO 90/08329 | * | 1/1990 |

* cited by examiner

Primary Examiner—Diego Gutierrez
Assistant Examiner—Tiffany A. Fetzner
(74) Attorney, Agent, or Firm—Paul Vincent

(57) ABSTRACT

An actively shielded superconducting magnet coil system (1) for generating a magnetic field in a working volume (6), which is rotationally symmetric about a z-axis, comprising a radially inner main field winding (5) and a radially outer shielding winding (7), and an electrically highly conductive shielding cylinder (radially inner shielding cylinder) (8a/8b) which is disposed radially inside the main field winding (5) or between main field winding (5) and the shielding winding (7) is characterized in that at least one further electrically highly conductive shielding cylinder (9) is disposed radially outside the shielding winding (7). The inventive magnet coil system prevents generation of a fringe field flash in the outer region of the magnet coil system in case of a quench.

12 Claims, 1 Drawing Sheet

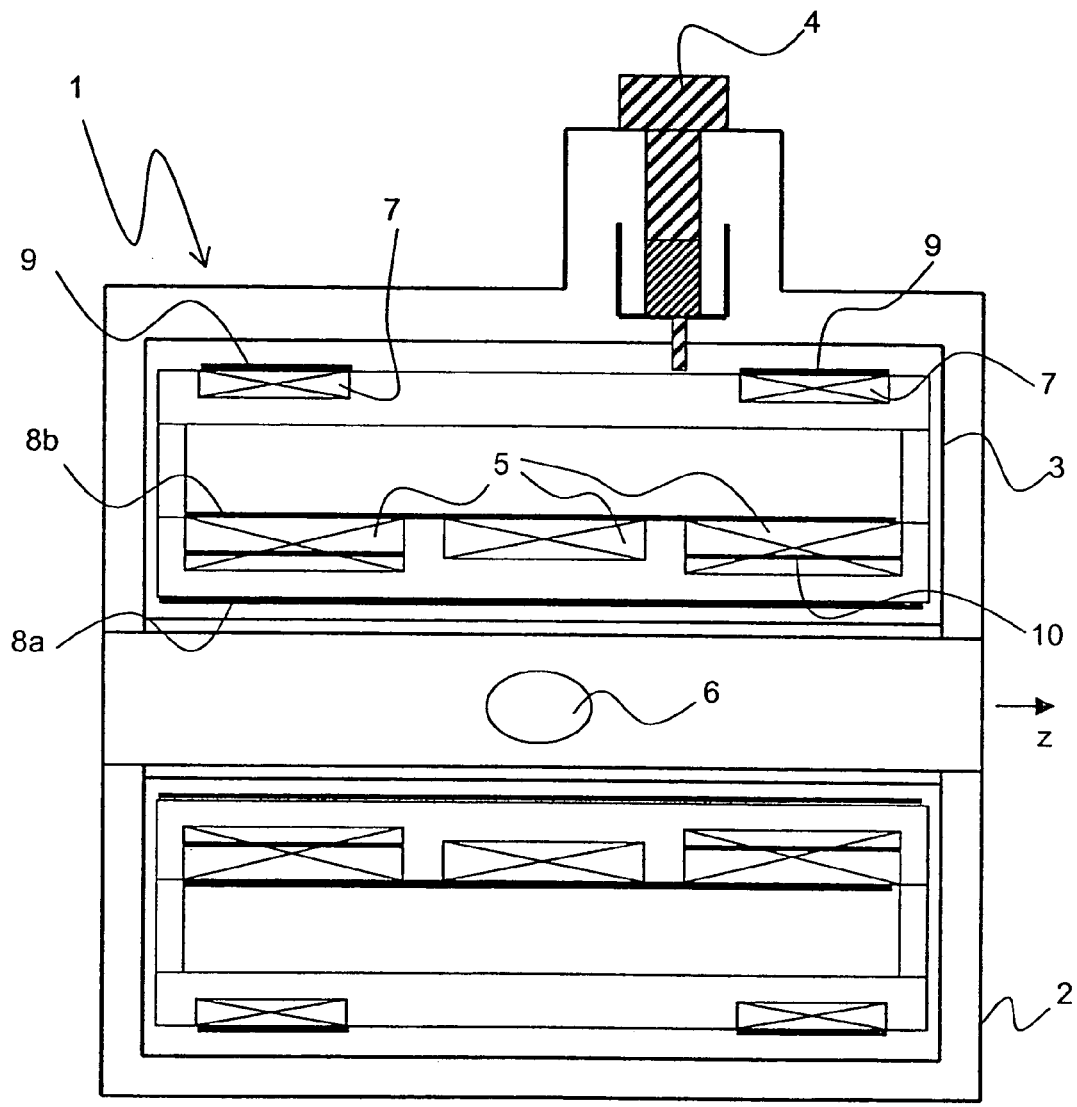
Fig.

ADDITIONAL FRINGE FIELD SHIELD FOR A SUPERCONDUCTING MAGNET COIL SYSTEM

This application claims Paris Convention priority of DE 103 54 677.4 filed Nov. 22, 2003 the complete disclosure of which is hereby incorporated by reference.

BACKGROUND OF THE INVENTION

The invention concerns an actively shielded superconducting magnet coil system for generating a magnetic field in a working volume, which is designed to be rotationally symmetric about a z-axis, comprising a radially inner main field winding and a radially outer shielding winding, and an electrically highly conductive shielding cylinder (radially inner shielding cylinder) which is disposed radially inside the main field winding or between the main field winding and the shielding winding.

An actively shielded magnet coil system without radially inner shielding cylinder is disclosed e.g. in DE 100 33 411 A1. A magnet coil system which is not actively shielded comprising a radially inner shielding cylinder is disclosed e.g. in DE 39 00 725 A1.

Superconducting magnet coil systems are used to generate strong homogeneous magnetic fields in nuclear magnetic resonance (NMR) apparatuses.

Such magnet coil systems comprise a main field winding for generating the magnetic field in a working volume and a shielding winding to reduce stray fields in the surroundings of the magnet during operation thereby reducing the region of danger around the magnet coil system. The magnet coil systems moreover typically comprise an electrically conductive shielding cylinder radially inside the main field winding or between the main field winding and the shielding winding to protect the working volume from external magnetic field disturbances and keep the magnetic field in the working volume constant.

In case of a sudden transition of the main field coil into the normally conducting state (quench), this shielding cylinder (referred to as radially inner shielding cylinder below) produces a substantial sudden fringe field in the external region of the magnet coil system. This fringe field flash endangers technical systems and people, e.g. people having a pacemaker, in the region of the magnet coil system.

It is therefore the underlying purpose of the present invention to further develop a magnet coil system such that a fringe field flash in the external region of the magnet coil system is prevented in case of a quench.

SUMMARY OF THE INVENTION

This object is achieved with a magnet coil system of the above-mentioned type in that at least one further electrically highly conductive shielding cylinder is disposed radially outside of the shielding winding.

In case of a quench, a fringe field flash propagates from the main field winding or the radially inner shielding cylinder and induces a current in the further radially outer shielding cylinder, whose associated magnetic field is opposite to this fringe field flash. In consequence thereof, the fringe field outside of the radially outer shielding cylinder, and therefore outside of the magnet coil system, is weakened.

In one particularly preferred embodiment of the inventive magnet coil system, the further shielding cylinder has a larger time constant L/R for eddy currents in the peripheral direction than the radially inner shielding cylinder, with L being the inductance and R the ohmic resistance. The further radially outer shielding cylinder can then react with sufficient speed to the magnetic field penetrating through the inner shielding cylinder or to its changes and compensates for the fringe field flash along its full length.

In an alternative embodiment, at least the further radially outer shielding cylinder is superconducting. This theoretically permits complete shielding of the fringe field flash in the surroundings.

In a preferred further development of this embodiment, the radially inner shielding cylinder is also superconducting and has a smaller-critical value than the further radially outer shielding cylinder. In this case, the radially outer shielding cylinder can completely accept the induced current load of a quenched radially inner shielding cylinder.

In another preferred embodiment of the inventive magnet coil system, the radially inner shielding cylinder and/or the further radially outer shielding cylinder is/are formed as a flat, multi-layer arrangement of superconducting wires, wherein the arrangement comprises a normally conducting substrate and at least one lead which is electrically conductingly connected to the substrate and which is superconducting under predetermined conditions. The superconducting wires in the respective layers are mainly disposed such that they do not cross and a resistive electric contact is provided between the superconducting wires of different layers, the superconducting wires of at least two neighboring layers crossing, wherein the arrangement has no closed superconducting loops. This flat arrangement has a much higher electrical conductivity than a normally conducting metallic shielding material but has a non-zero specific resistance. The shielding cylinders are therefore very efficient including, in particular, the case of low-frequency field disturbances (around 1 Hz), but do not block generation of the magnetic field during charging of the main field winding. The arrangement is also susceptible to the superconduction instabilities which are known from conventional flat superconductors.

In an alternative embodiment, the radially inner shielding cylinder and/or the further radially outer shielding cylinder are designed as resistive shielding cylinder(s), in particular, made from Cu or Al. Cu or Al are thereby typically present in the form of flat sheet metal. Purchase and maintenance of this embodiment are particularly inexpensive.

In another preferred embodiment, the further radially outer shielding cylinder is wound from wire, in particular, superconducting wire, and the ends of the wire are short-circuited or terminated with a finite ohmic resistance. A winding of superconducting wire with inductance L and resistance R may e.g. be closed to produce a time constant $\tau = L/R$. Wire windings can be produced in a simple and inexpensive manner with commercially available wire material. Moreover, the induced current distribution in the outer shielding cylinder is always rotationally symmetric in case of a quench and can therefore be easily realized with a wire winding.

The invention also includes an NMR apparatus, MRI (magnetic resonance imaging) apparatus or ICR (ion cyclotron resonance) apparatus which is characterized by comprising the inventive magnet coil system described above.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and explained in more detail with reference to an embodiment.

BRIEF DESCRIPTION OF THE DRAWING

The single FIGURE shows an inventive magnet coil system.

DESCRIPTION OF THE PREFERRED EMBODIMENT

The inventive magnet coil system 1 in the FIGURE comprises a vacuum tank 2 which contains a helium tank 3 which is approximately half filled with liquid helium. The helium is cooled through a refrigerator comprising a cooling head 4 which projects into the helium tank 3.

The helium tank 3 has a main field winding 5 which is superconducting during operation. The main field winding 5 generates a strong homogeneous magnetic field at the location of a working volume 6. This magnetic field is rotationally symmetric about a horizontal axis which extends through the working volume 6 and defines a z-direction. To prevent fringe fields outside of the magnet coil system 1, the magnet coil system 1 also comprises a shielding winding 7. It is disposed at a radial separation, outside of the main field winding 5. During normal operation, the current flow in the shielding winding 7 is opposite to the current flow in the main field winding 5.

The magnet coil system 1 also comprises a radially inner shielding cylinder 8a/8b. It may be disposed radially inside the main field winding 5 (reference numeral 8a). The radially inner shielding cylinder may alternatively be disposed between main field winding 5 and shielding winding 7 (reference numeral 8b). The radially inner shielding cylinder 8a/8b mainly inductively shields the working volume 6 from external magnetic field disturbances which can be generated i.e. through pulsed operation of the refrigerator, in particular, periodic magnetic reversal of a regenerator material on the cooling head 4. The radially inner shielding cylinder 8a/8b therefore has good electrically conducting properties and is preferably superconducting.

In accordance with the invention, the magnet coil system 1 also comprises a further radially outer shielding cylinder 9. The shielding cylinder 9 has two partial sections in the FIGURE which are each disposed radially outside on the shielding winding 7. In case of a quench of the main field winding 5 and/or optionally of the radially inner shielding cylinder 8a/8b, the outer shielding cylinder 9 can inductively suppress and block a fringe field in the outer region of the magnet coil system 1.

Further electrically highly conductive cylindrical surfaces 10, which may have superconducting sections, can also be included. In case of a quench of the main field winding 5, these help to prevent rapid propagation of the normally conducting regions in the main field winding 5 and thereby prevent local overheating.

I claim:

1. An actively shielded superconducting magnet coil system for generating a magnetic field in a working volume which is designed to be rotationally symmetric about a z-axis, the magnet coil system comprising:
    a main field winding;
    a shielding winding disposed radially outside of said main field winding;
    a highly electrically conducting first shielding cylinder disposed radially inside of said shielding winding, said first shielding cylinder structured to allow current flow in any direction within a surface thereof; and
    a highly electrically conducting second shielding cylinder disposed radially outside of said shielding winding, wherein said first and said second shielding cylinder are coupled via induction only.

2. The magnet coil system of claim 1, wherein said first shielding cylinder is disposed radially inside of said main field winding.

3. The magnet coil system of claim 1, wherein said first shielding cylinder is disposed between said main field winding and said shielding winding.

4. The magnet coil system of claim 1, wherein said second shielding cylinder has a second time constant L/R for eddy currents in a peripheral direction which is larger than a first time constant of said first shielding cylinder, wherein L is an inductance and R is an ohmic resistance.

5. The magnet coil system of claim 1, wherein said second shielding cylinder is superconducting.

6. The magnet coil system of claim 5, wherein said first shielding cylinder is superconducting, with said first shielding cylinder having a first critical current which is smaller than a second critical current said second shielding cylinder.

7. The magnet coil system of claim 1, wherein said first shielding cylinder and/or said second shielding cylinder is/are formed as a flat multi-layer arrangement of superconducting wires, wherein said arrangement comprises a normally conducting substrate and at least one lead which is connected to said substrate in an electrically conducting manner and which is superconducting under predetermined conditions, the superconducting wires being disposed in each respective layer such that they substantiality do not cross, wherein a resistive electric contact is provided between the superconducting wires of different layers, and the superconducting wires of at least two neighboring layers extend at an angle with respect to each other, wherein said arrangement contains no closed superconducting loops.

8. The magnet coil system of claim 1, wherein said first shielding cylinder and/or said second shielding cylinder is/are formed as resistive shielding cylinder(s).

9. The magnet coil system of claim 8, wherein said resistive shielding cylinder is made from Cu or Al.

10. The magnet coil system of claim 1, wherein said second shielding cylinder is wound from wire and ends of said wire are short-circuited or terminated with a finite ohmic resistance.

11. The magnet coil system of claim 10, wherein said wire is superconducting.

12. An NMR, MRI or ICR apparatus, comprising the magnet coil system of claim 1.

* * * * *